(12) United States Patent
Baek et al.

(10) Patent No.: US 7,724,072 B2
(45) Date of Patent: May 25, 2010

(54) VOLTAGE GENERATOR OF SEMICONDUCTOR INTEGRATED CIRCUIT

(75) Inventors: Chang Ki Baek, Ichon (KR); Young Chul Sohn, Ichon (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 12/034,529

(22) Filed: Feb. 20, 2008

(65) Prior Publication Data

US 2009/0091366 A1    Apr. 9, 2009

(30) Foreign Application Priority Data

Oct. 9, 2007   (KR) .................. 10-2007-0101652

(51) Int. Cl.
*G05F 1/10* (2006.01)
(52) U.S. Cl. ....................................... 327/536
(58) Field of Classification Search ................. 327/535, 327/536, 537
See application file for complete search history.

(56) References Cited

U.S. PATENT DOCUMENTS

| | | | | | |
|---|---|---|---|---|---|
| 5,561,385 | A | * | 10/1996 | Choi | ........................... 327/536 |
| 5,818,766 | A | * | 10/1998 | Song | ...................... 365/189.11 |
| 6,130,829 | A | * | 10/2000 | Shin | ............................. 363/60 |
| 6,194,954 | B1 | * | 2/2001 | Kim et al. | ..................... 327/535 |
| 6,504,783 | B2 | | 1/2003 | Jo | |
| 6,836,176 | B2 | * | 12/2004 | Zeng et al. | ................... 327/535 |
| 7,482,856 | B2 | * | 1/2009 | Lee | ............................. 327/536 |

FOREIGN PATENT DOCUMENTS

| | | |
|---|---|---|
| JP | 2002-170387 | 6/2002 |
| KR | 1020010011502 A | 2/2001 |
| KR | 1020030092584 A | 12/2003 |

* cited by examiner

*Primary Examiner*—Jeffrey S Zweizig
(74) *Attorney, Agent, or Firm*—Baker & McKenzie LLP

(57) ABSTRACT

A voltage generator includes a detector for outputting a driving signal according to comparison results of a reference voltage and a pumping voltage, an oscillator for generating an oscillation signal in response to the driving signal and varying a period of the oscillation signal according to a level of the pumping voltage, and a pump for pumping an external voltage in response to the oscillation signal to generate the pumping voltage. The voltage generator can quickly increase a pumping voltage up to the target level and improve the efficiency of the pumping voltage by minimizing the ripple components of the pumping voltage.

15 Claims, 4 Drawing Sheets

VOLTAGE GENERATOR OF SEMICONDUCTOR INTEGRATED CIRCUIT

CROSS-REFERENCES TO RELATED APPLICATION

The present application claims priority under 35 U.S.C. 119(a) to Korean application number 10-2007-0101652, filed on Oct. 9, 2007, in the Korean Patent Office, which is incorporated by reference in its entirety as if set forth in full.

BACKGROUND

1. Technical Field

The embodiments described herein relate to a semiconductor integrated circuit and, more particularly, to a voltage generator of a semiconductor integrated circuit.

2. Related Art

A conventional semiconductor integrated circuit uses voltages of various levels. Among them, a pumping voltage (VPP) is generated using an external voltage (VDD) in a voltage generator of the semiconductor integrated circuit.

As shown in FIG. 1, a conventional voltage generator in a semiconductor integrated circuit includes a detector 1, an oscillator 2 and a pump 3. The detector 1 compares a reference voltage (VREF) with a feedback pumping voltage (VPP) to generate an oscillator driving signal 'OSC_EN'. The oscillator 2 oscillates with the oscillator driving signal 'OSC_EN' to generate an oscillation signal 'OSC'. The pump 3 pumps an external voltage (VDD) in response to the oscillation signal 'OSC' to generate the pumping voltage (VPP).

Hereinafter, the operation of a conventional voltage generator will be described.

When the pumping voltage (VPP) is at a low level as compared with the reference voltage (VREF), the detector 1 activates the oscillator driving signal 'OSC_EN'. However, when the pumping voltage (VPP) is at a high level as compared with the reference voltage (VREF), the detector 1 deactivates the oscillator driving signal 'OSC_EN'.

During the initial operation of the voltage generator, the pumping voltage (VPP) is at a level lower than that of the reference voltage (VREF). The reference voltage (VREF) is set in proportion to the target level of the pumping voltage (VPP). Since the pumping voltage (VPP) is at a level lower than that of the reference voltage (VREF), the detector 1 activates and outputs the oscillator driving signal 'OSC_EN'. The oscillator 2 oscillates during the activation period of the oscillator driving signal 'OSC_EN' and outputs the oscillation signal 'OSC' having a fixed period as shown in FIG. 2. The pump 3 pumps the external voltage (VDD) in response to the oscillation signal 'OSC' having a fixed period, thereby outputting the pumping voltage (VPP).

As shown in FIG. 2, since the pump 3 repeatedly turns the pumping operation on/off in response to the oscillation signal 'OSC' having a fixed period even after the level of the pumping voltage (VPP) reaches a target level, the pumping voltage (VPP) continuously creates ripple components.

The pumping voltage (VPP) output from the pump 3 is fed back to the detector 1. Accordingly, the pumping voltage (VPP) maintains the target level through the repetition of the aforementioned process.

However, according in a conventional voltage generator, since the pump 3 repeatedly turns the pumping operation on/off in response to the oscillation signal 'OSC' having a fixed period, the following problems may occur: First, the pumping voltage (VPP) may not quickly reach the target level. Second, since the pumping voltage (VPP) has many ripple components, the pumping voltage (VPP) becomes unstable.

SUMMARY

A voltage generator of a semiconductor integrated circuit that can reduce time required when a pumping voltage reaches a target level and minimize the ripple components of the pumping voltage is described herein.

According to one aspect, there is provided a voltage generator of a semiconductor integrated circuit comprising a detector for outputting a driving signal according to comparison results of a reference voltage and a pumping voltage, an oscillator for generating an oscillation signal in response to the driving signal and varying a period of the oscillation signal according to a level of the pumping voltage, and a pump for pumping an external voltage in response to the oscillation signal to generate the pumping voltage.

According to another aspect, there is provided a voltage generator of a semiconductor integrated circuit comprising a detector for outputting a driving signal according to comparison results of a reference voltage and a pumping voltage, and adjusting shift timing of the driving signal in response to variation in a level of an external voltage, an oscillator for generating an oscillation signal in response to the driving signal and varying a period of the oscillation signal according to a level of the pumping voltage, and a pump for pumping the external voltage in response to the oscillation signal to generate the pumping voltage.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
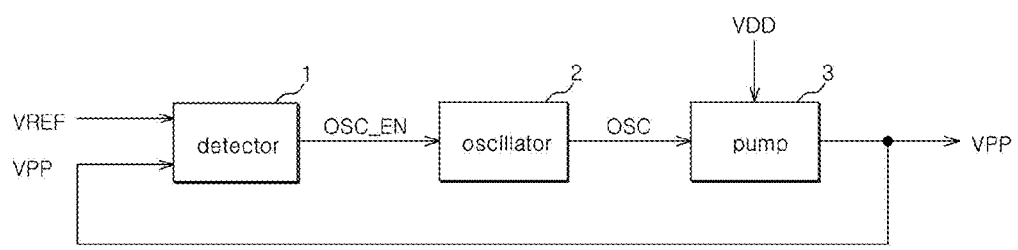
FIG. 1 is a block diagram of an exemplary voltage generator of a semiconductor integrated circuit.
Figure 2:
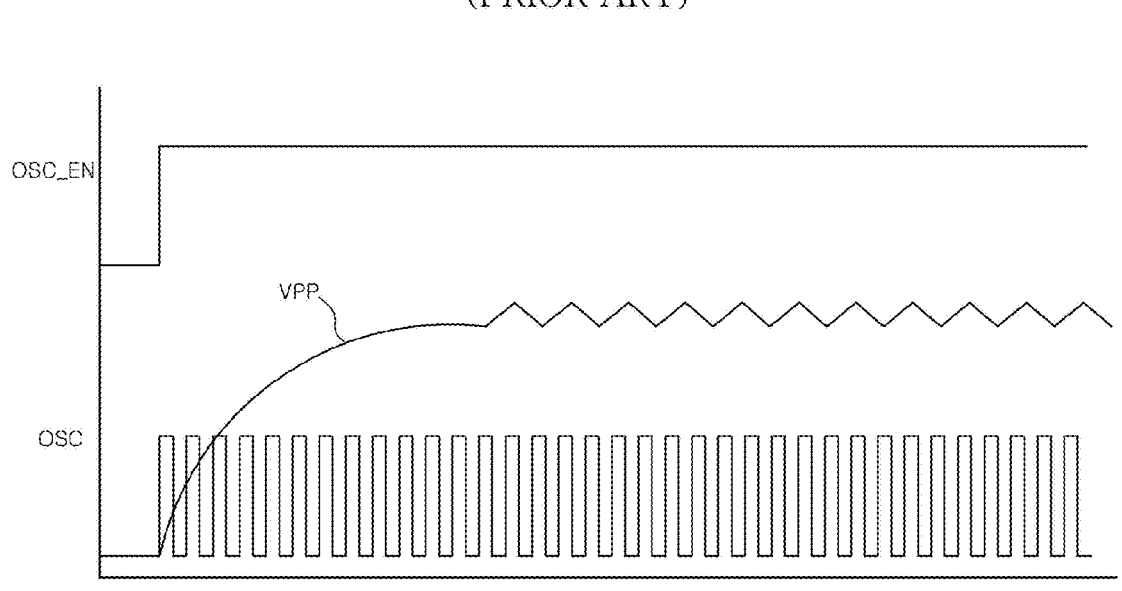
FIG. 2 is a graph showing an output timing of the voltage generator of FIG. 1.
Figure 3:
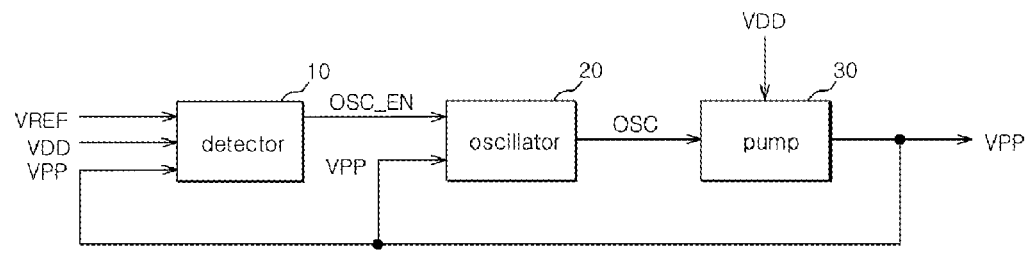
FIG. 3 is a block diagram of a voltage generator of a semiconductor integrated circuit according to one embodiment.

FIG. 3 is a diagram illustrating an example voltage generator 11 configured in accordance with one embodiment. As shown in FIG. 3, the voltage generator 11 can include a detector 10, an oscillator 20, and a pump 30.

The detector 10 can be configured to output an oscillator driving signal 'OSC_EN' according to comparison results of a reference voltage (VREF) and a pumping voltage (VPP) and adjust the shift timing of the oscillator driving signal 'OSC_EN' in response to a variation in the level of an external voltage (VDD). The oscillator 20 can be configured to generate an oscillation signal 'OSC' in response to the oscillator driving signal 'OSC_EN' and vary the period of the oscillation signal 'OSC' according to the level of the pumping voltage (VPP). The pump 30 can be configured to pump the external voltage (VDD) in response to the oscillation signal 'OSC' to generate the pumping voltage (VPP).

Figure 4:
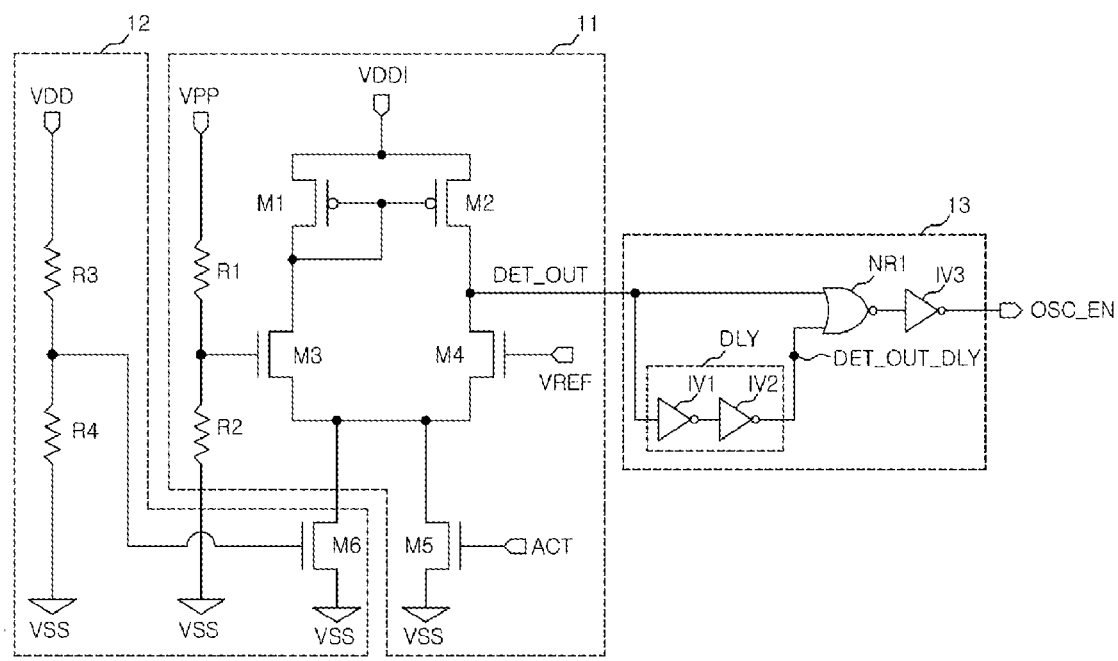
FIG. 4 is a circuit diagram of a detector that can be included in the generator illustrated in FIG. 3.

As shown in FIG. 4, the detector 10 can include a comparator 11, a slew rate controller 12, and an activation time adjustor 13.

The comparator 11 can be configured to compare the reference voltage (VREF) with the pumping voltage (VPP) to output a detection signal 'DET_OUT'. The comparator 11 can include distribution resistors R1 and R2 and a plurality of transistors M1 to M5. The distribution resistors R1 and R2 can distribute the pumping voltage (VPP) to output a first distribution voltage. The transistors M1 and M2 constitute a current mirror. The first distribution voltage can be input to the gate of the transistor M3. Further, the reference voltage (VREF) can be input to the gate of the transistor M4. The transistor M5 can have a source that receives a ground voltage (VSS) and can be configured to determine the operation of the comparator 11 according to an active signal 'ACT' input to the gate thereof.

The slew rate controller 12 can vary the slew rate of the detection signal 'DET_OUT' according to the level of the external voltage (VDD). The slew rate controller 12 can include distribution resistors R3 and R4 and a transistor M6. The distribution resistors R3 and R4 can be configured to distribute the external voltage (VDD) to output a second distribution voltage. The transistor M6 can have a source that receives the ground voltage (VSS), a drain connected to the sources of the transistors M3 and M4, and a gate that receives the second distribution voltage. The transistor M6 can vary the amount of an electric current flowing in the comparator 11 according to a variation in the level of the second distribution voltage input to the gate, thereby varying the slew rate of the detection signal 'DET_OUT'.

If the level of the second distribution voltage inputted to the gate is increased, the transistor M6 can increase the amount of the electric current flowing in the comparator 11 to increase the slew rate of the detection signal 'DET_OUT'. That is, the level shift of the detection signal 'DET_OUT' can be achieved within a short period of time.

The activation time adjustor 13 can be configured to increase the activation time of the detection signal 'DET_OUT' by a preset time to output the detection signal 'DET_OUT'. The activation time adjustor 13 can include a delay unit DLY, a NOR gate NR1 and an inverter IV3. The delay unit DLY can receive the detection signal 'DET_OUT' and delay the detection signal 'DET_OUT' by a preset time to output a detection delay signal 'DET_OUT_DLY'. The NOR gate NR1 can receive the detection signal 'DET_OUT' and the detection delay signal 'DET_OUT_DLY'. The inverter IV3 can receive an output of the NOR gate NR1. The delay unit DLY can include an inverter array and can control the preset time by adjusting the number of inverters constituting the inverter array.

FIG. 4 shows an example in which the delay unit DLY includes two inverters IV1 and IV2.

Figure 5:
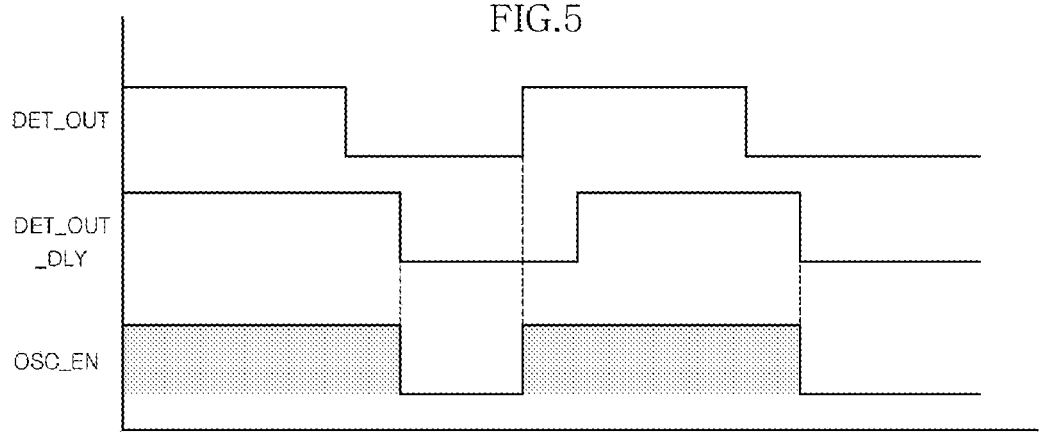
FIG. 5 is a graph showing an output timing for the detector of FIG. 4.

As shown in FIG. 5, the activation time adjustor 13 can be configured to increase the activation time of the detection signal 'DET_OUT' by the preset time by ORing the detection signal 'DET_OUT' and the detection delay signal 'DET_OUT_DLY'.

Figure 6:
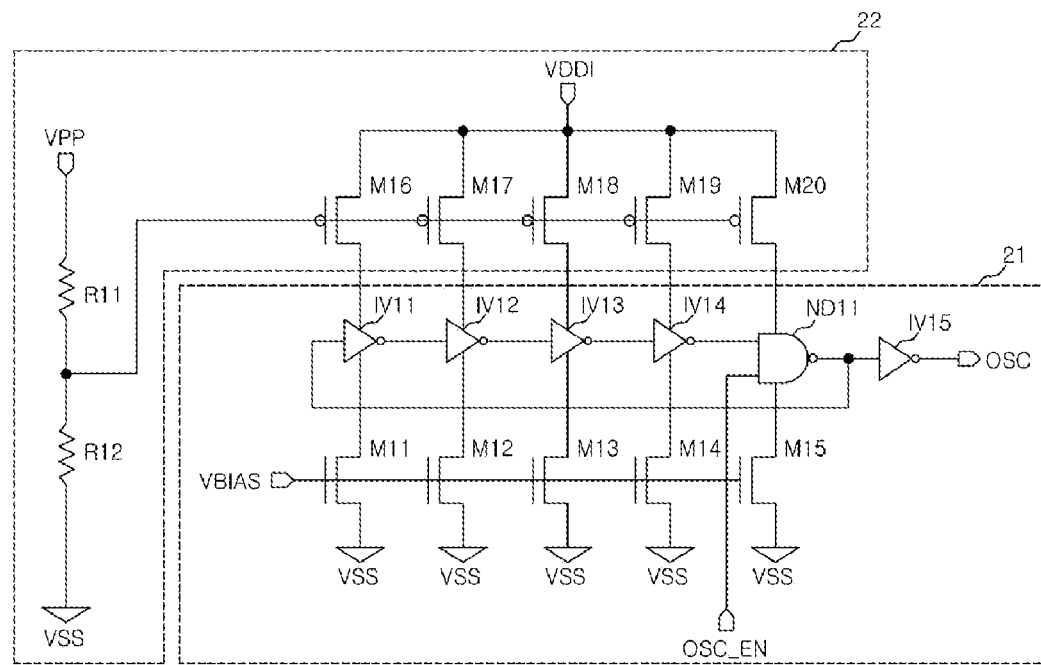
FIG. 6 is a circuit diagram of an oscillator that can be included in the generator illustrated in FIG. 3.

The oscillator 20 can be configured to generate the oscillation signal 'OSC' in response to the oscillator driving signal 'OSC_EN' and vary the period of the oscillation signal 'OSC' according to the level of the pumping voltage (VPP). As shown in FIG. 6, the oscillator 20 can include an oscillating unit 21 and a period control unit 22.

The oscillating unit 21 can be configured to output the oscillation signal 'OSC' in response to the oscillator driving signal 'OSC_EN'. The oscillating unit 21 can include an NAND gate ND11, a plurality of inverters IV11 to IV15, and a plurality of transistors M11 to M15. The NAND gate ND11 and the inverters IV11 to IV15 form a ring oscillator structure, and the NAND gate ND11 can be configured to determine the operation of the ring oscillator according to the oscillator driving signal 'OSC_EN'. The transistors M11 to M15 are connected between ground voltage (VSS) input terminals and the inverters IV11 to IV15 and the NAND gate ND11, respectively. Further, the transistors M11 to M15 can commonly receive a bias voltage (VBIAS) through the gates thereof, respectively.

The period control unit 22 varies the period of the oscillation signal 'OSC' by controlling the delay of the signal output from the oscillating unit 21 according to the level of the pumping voltage (VPP). The period control unit 22 can include distribution resistors R11 and R12 and a plurality of transistors M16 to M20. The distribution resistors R11 and R12 can be configured to distribute the pumping voltage (VPP) to output a third distribution voltage. The transistors M16 to M20 can have sources connected to the supply voltage terminal (VDDI), drains connected between the supply voltage input terminals and the inverters IV11 to IV1 and the NAND gate ND11 respectively, and gates that commonly receive the third distribution voltage. The period control unit 22 can be configured to vary the signal delay time of the inverters IV11 to IV15 and the NAND gate ND11 by using the transistors M16 to M20 according to a variation in the level of the pumping voltage (VPP), thereby varying the total signal delay of the oscillating unit 21. That is, if the level of the pumping voltage (VPP) is increased, then the period control unit 22 lengthens the period of the oscillation signal 'OSC' by increasing the signal delay of the oscillating unit 21. In addition, if the level of the pumping voltage (VPP) is decreased, then the period control unit 22 shortens the period of the oscillation signal 'OSC' by reducing the signal delay of the oscillating unit 21.

Hereinafter, the operation of the voltage generator 11 will be described in accordance with one embodiment.

The detector 10 shown in FIG. 4 outputs the oscillator driving signal 'OSC_EN' according to comparison results of the reference voltage (VREF) and the pumping voltage (VPP) and adjusts the shift timing of the oscillator driving signal 'OSC_EN' in response to a variation in the level of the external voltage (VDD). The comparator 11 outputs the detection signal 'DET_OUT' during the period for which the active signal 'ACT' is activated according to the comparison results of the reference voltage (VREF) and the pumping voltage (VPP). Simultaneously, the slew rate controller 12 forms an additional current path in the comparator 11 by using the transistor M6 that operates responding to the variation in the level of the external voltage (VDD), so that the level shift of the detection signal 'DET_OUT' can be achieved within a short period of time. The activation time adjustor 13 increases the activation period of the detection signal 'DET_OUT' to output the oscillator driving signal 'OSC_EN'.

That is, the detector 10 increases the response speed of the detection signal 'DET_OUT' corresponding to the variation in the level of the pumping voltage (VPP) by using the variation in the level of the external voltage (VDD), so that the oscillator driving signal 'OSC_EN' can be quickly activated or deactivated. Further, the detector 10 reduces the discharge time of the pumping voltage (VPP) by increasing the activation period of the oscillator driving signal 'OSC_EN', so that the level of the pumping voltage (VPP) can be prevented from being quickly lowered below the target level.

The oscillator 20 shown in FIG. 6 generates the oscillation signal OSC during the activation period of the oscillator driving signal 'OSC_EN'. The pump 30 pumps the external voltage (VDD) in response to the oscillation signal OSC to generate the pumping voltage (VPP). During the initial operation of the voltage generator, since the pumping voltage (VPP) is in a low level, the transistors M16 to M20 of the period control unit 22 have resistance values in a turn-on state.

Since the transistors M16 to M20 are in the turn-on state, the oscillation signal OSC is outputted, which has a period corresponding to the total signal delay time of the inverter array IV11 to IV14 and the NAND gate ND11 of the oscillating unit 21 according to the level of the bias voltage (VBIAS).

Meanwhile, as the level of the pumping voltage (VPP) is increased according to the pumping operation of the pump 30, the resistance values of the transistors M16 to M20 of the period control unit 22 are increased.

Since the resistance values of the transistors M16 to M20 are increased, the total signal delay time of the inverter array IV11 to IV14 and the NAND gate ND11 of the oscillating unit 21 is increased. Also, since the total signal delay time of the inverter array IV11 to IV14 and the NAND gate ND11 of the oscillating unit 21 is increased, the period of the oscillation signal 'OSC' is increased.

Figure 7:
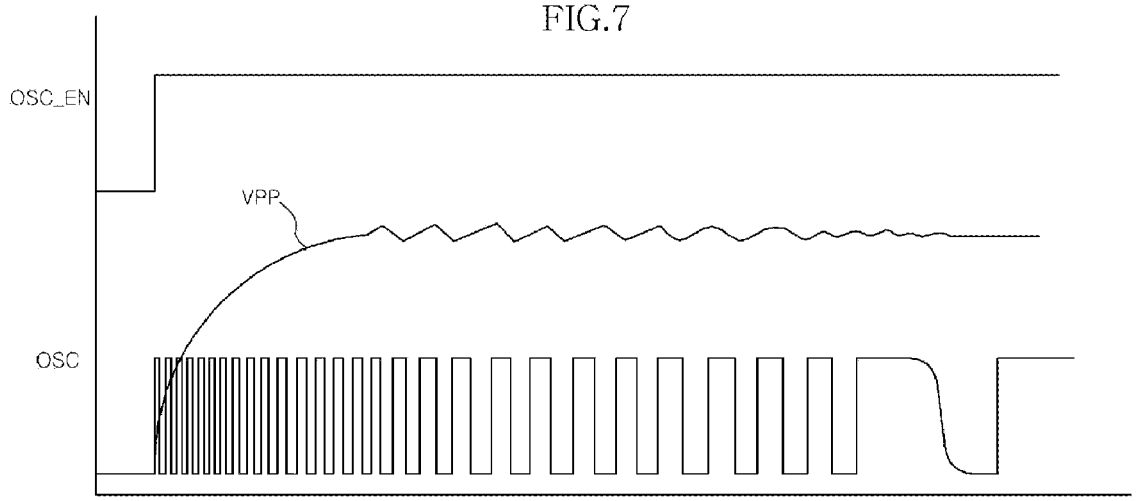
FIGS. 7 and 8 are graphs showing an output timing of the voltage generator of FIG. 3.

FIG. 7 is a graph showing the waveform of the oscillation signal 'OSC' during one period of the oscillator driving signal 'OSC_EN'. Referring to FIG. 7, it can be understood that the period of the oscillation signal 'OSC' is gradually lengthened as the level of the pumping voltage (VPP) is increased. Since the period of the oscillation signal 'OSC' is lengthened in proportion to the level of the pumping voltage (VPP), the ripple components of the pumping voltage (VPP) are gradually reduced.

Figure 8:
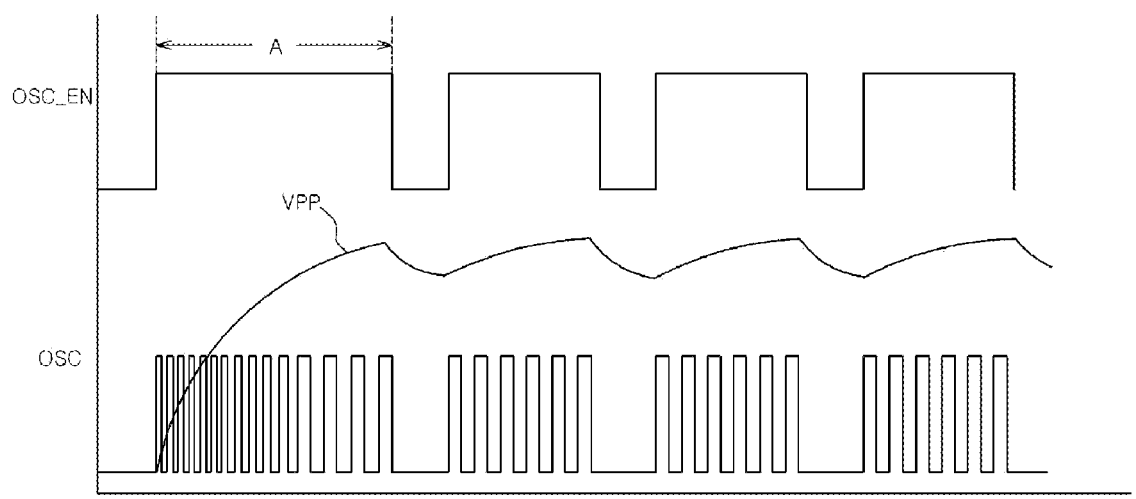

FIG. 8 is a graph showing the waveform of the oscillation signal 'OSC' according to a repetition of the period of the oscillator driving signal 'OSC_EN'. Referring to FIG. 8, since the pumping voltage (VPP) approximates the target level and enters a stable state after the initial interval A, the oscillation signal 'OSC' maintains a long period differently from the initial interval A. After the initial interval A, the period of the oscillation signal 'OSC' is varied in real time according to the level of the pumping voltage (VPP).

As described above, the voltage generator of the semiconductor integrated circuit according to the embodiments described herein can quickly increase a pumping voltage up to the target level and improve the efficiency of the pumping voltage by minimizing the ripple components of the pumping voltage.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. A voltage generator of a semiconductor integrated circuit, the voltage generator comprising:
   a detector for outputting a driving signal according to comparison results of a reference voltage and a pumping voltage;
   an oscillator for generating an oscillation signal in response to the driving signal and varying a period of the oscillation signal according to a level of the pumping voltage; and
   a pump for pumping an external voltage in response to the oscillation signal to generate the pumping voltage,
   wherein the detector includes:
      a comparator for comparing the reference voltage with the pumping voltage to output a detection signal, and
      an activation time adjustor for varying and outputting an activation time of the detection signal, and
   wherein the activation time adjustor includes:
      a delay unit for receiving the detection signal, and
      a logic device for receiving the detection signal and an output of the delay unit.

2. The voltage generator of claim 1, wherein the comparator activates and outputs the detection signal when the reference voltage is in a high level as compared with the pumping voltage.

3. The voltage generator of claim 1, wherein the activation time adjustor increases the activation time of the detection signal by a preset time.

4. The voltage generator of claim 1, wherein the oscillator includes:
   an oscillating unit for generating the oscillation signal in response to the driving signal; and
   a period control unit for varying the period of the oscillation signal by controlling a signal delay of the oscillating unit according to the level of the pumping voltage.

5. The voltage generator of claim 4, wherein the oscillating unit includes:
   a logic device for inverting an input signal in response to the driving signal and outputting the inverted signal; and
   an inverter array for receiving an output of the logic device and transmitting the output to the logic device.

6. The voltage generator of claim 4, wherein the period control unit includes:
   a plurality of switching devices connected to a current path of the oscillating unit; and
   a distribution resistor for distributing the pumping voltage to output a distribution voltage to control terminals of the plurality of switching devices.

7. A voltage generator of a semiconductor integrated circuit, the voltage generator comprising:
   a detector for outputting a driving signal according to comparison results of a reference voltage and a pumping voltage and adjusting a shift timing of the driving signal in response to a variation in a level of an external voltage VDD;
   an oscillator for generating an oscillation signal in response to the driving signal and varying a period of the oscillation signal according to a level of the pumping voltage; and
   a pump for pumping the external voltage VDD in response to the oscillation signal to generate the pumping voltage.

8. The voltage generator of claim 7, wherein the detector includes:
   a comparator for comparing the reference voltage with the pumping voltage to output a detection signal;
   a slew rate controller for varying a slew rate of the detection signal according to the level of the external voltage VDD; and
   an activation time adjustor for varying an activation time of the detection signal.

9. The voltage generator of claim 8, wherein the comparator activates the detection signal when the reference voltage is in a high level as compared with the pumping voltage.

10. The voltage generator of claim 8, wherein the slew rate controller includes:
   a switching device connected between the comparator and a ground terminal; and
   a distribution resistor for distributing the external voltage VDD to output a distribution voltage to a control terminal of the switching device.

11. The voltage generator of claim 8, wherein the activation time adjustor increases the activation time of the detection signal by a preset time.

12. The voltage generator of claim 11, wherein the activation time adjustor includes:
   a delay unit for receiving the detection signal; and
   a logic device for receiving the detection signal and an output of the delay unit.

13. The voltage generator of claim 7, wherein the oscillator includes:
   an oscillating unit for generating the oscillation signal in response to the driving signal; and
   a period control unit for varying the period of the oscillation signal by controlling a signal delay of the oscillating unit according to the level of the pumping voltage.

14. The voltage generator of claim 13, wherein the oscillating unit includes:
   a logic device for inverting an input signal in response to the driving signal and outputting the inverted signal; and
   an inverter array for receiving an output of the logic device and transmitting the output to the logic device.

15. The voltage generator of claim 13, wherein the period control unit includes:
   a plurality of switching devices connected to a current path of the oscillating unit; and
   a distribution resistor for distributing the pumping voltage to output a distribution voltage to control terminals of the plurality of switching devices.

* * * * *